(12) United States Patent
Inui

(10) Patent No.: US 10,090,168 B2
(45) Date of Patent: Oct. 2, 2018

(54) PLASMA ETCHING METHOD

(71) Applicant: ZEON CORPORATION, Chiyoda-ku, Tokyo (JP)

(72) Inventor: Hirotoshi Inui, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/541,812

(22) PCT Filed: Jan. 19, 2016

(86) PCT No.: PCT/JP2016/051456
§ 371 (c)(1),
(2) Date: Jul. 6, 2017

(87) PCT Pub. No.: WO2016/117563
PCT Pub. Date: Jul. 28, 2016

(65) Prior Publication Data
US 2017/0372915 A1    Dec. 28, 2017

(30) Foreign Application Priority Data
Jan. 22, 2015  (JP) .................. 2015-010540

(51) Int. Cl.
*H01L 21/311* (2006.01)
*C09K 13/00* (2006.01)
(Continued)

(52) U.S. Cl.
CPC ........ *H01L 21/31116* (2013.01); *C09K 13/00* (2013.01); *H01L 21/022* (2013.01);
(Continued)

(58) Field of Classification Search
CPC .......... H01L 21/31116; C09K 13/00
(Continued)

(56) References Cited

U.S. PATENT DOCUMENTS

| | | | | |
|---|---|---|---|---|
| 2001/0005634 A1* | 6/2001 | Kajiwara | .......... | H01L 21/31116 438/706 |
| 2002/0013055 A1* | 1/2002 | Yamaguchi | ......... | H01L 21/0279 438/689 |
| 2015/0357200 A1* | 12/2015 | Inui | ................... | H01L 21/31116 438/706 |

FOREIGN PATENT DOCUMENTS

| | | |
|---|---|---|
| JP | H05221892 A | 8/1993 |
| JP | H06100475 A | 4/1994 |

(Continued)

OTHER PUBLICATIONS

Mar. 8, 2016, International Search Report issued in the International Patent Application No. PCT/JP2016/051456.
(Continued)

*Primary Examiner* — David S Blum
(74) *Attorney, Agent, or Firm* — Kenja IP Law PC

(57) ABSTRACT

The present invention is a plasma etching method comprising subjecting a silicon-containing film to plasma etching using a process gas, the process gas comprising a linear saturated fluorohydrocarbon compound represented by a formula (1), and a gaseous fluorine-containing compound (excluding the compound represented by the formula (1)) that functions as a fluorine radical source under plasma etching conditions, wherein x represents 3 or 4, y represents an integer from 5 to 9, and z represents an integer from 1 to 3. The present invention provides a plasma etching method that can selectively etch the silicon-containing film with respect to the mask, and form a hole or a trench having a good shape within a short time.

$$C_xH_yF_z \qquad (1)$$

11 Claims, 1 Drawing Sheet

(51) Int. Cl.
 *H01L 21/02* (2006.01)
 *H01L 27/11551* (2017.01)
 *H01L 27/11578* (2017.01)
 *H01L 27/11556* (2017.01)
 *H01L 27/11582* (2017.01)

(52) U.S. Cl.
 CPC .... *H01L 21/0217* (2013.01); *H01L 21/02164* (2013.01); *H01L 21/31144* (2013.01); *H01L 27/11551* (2013.01); *H01L 27/11556* (2013.01); *H01L 27/11578* (2013.01); *H01L 27/11582* (2013.01)

(58) Field of Classification Search
 USPC ........................................................ 438/700
 See application file for complete search history.

(56) References Cited

FOREIGN PATENT DOCUMENTS

| | | |
|---|---|---|
| JP | 2001250817 A | 9/2001 |
| JP | 2001358061 A | 12/2001 |
| WO | 2014070838 A1 | 5/2014 |
| WO | 2014104290 A1 | 7/2014 |

OTHER PUBLICATIONS

George A. Olah et al., "Synthetic Methods and Reactions. 63. Pyridinium Poly(hydrogen fluoride) (30% Pyridine-70% Hydrogen Fluoride): A Convenient Reagent for Organic Fluorination Reactions", J. Org. Chem., 1979, vol. 44, No. 22, pp. 3872-3881.

* cited by examiner

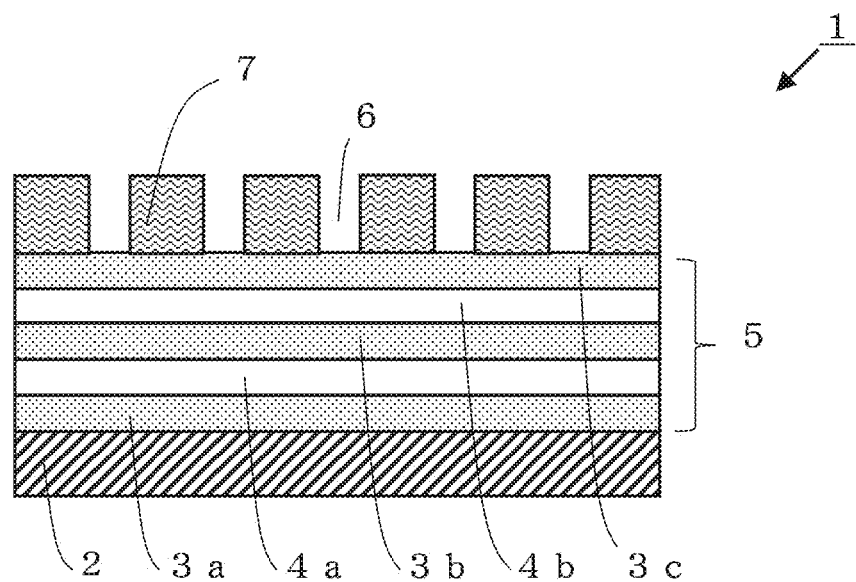

PLASMA ETCHING METHOD

TECHNICAL FIELD

The present invention relates to a method that subjects a silicon-containing film to plasma etching.

BACKGROUND ART

In recent years, a three-dimensional semiconductor memory such as a three-dimensional NAND flash memory has been developed in order to increase the storage capacity of a semiconductor memory. A three-dimensional NAND flash memory is normally produced by performing a plasma etching process on a multi-layer film in which insulating films that differ in dielectric constant are alternately stacked to form a hole or a trench. Examples of the multi-layer film include a multi-layer film in which a silicon oxide film and a silicon nitride film are stacked.

Since the multi-layer film is normally subjected to plasma etching while processing two or more films (e.g., silicon oxide film and silicon nitride film) that differ in properties without changing the etching conditions, it is necessary to employ etching conditions that are appropriate for all of the films included in the multi-layer film.

Since the multi-layer film normally has a thickness greater than that of a single-layer film, the etching time tends to increase when subjecting the multi-layer film to plasma etching as compared with the case of subjecting a single-layer film to plasma etching. Therefore, a hole or the like may be clogged by a deposited film, an abnormality in shape (e.g., bowing) may occur, or the mask may disappear when subjecting the multi-layer film to plasma etching.

As a method for solving the problems that may occur when subjecting the multi-layer film to plasma etching, Patent Literature 1 discloses a method that etches a multi-layer film that includes a silicon oxide film and a silicon nitride film using a process gas that includes a linear saturated fluorohydrocarbon compound represented by $C_xH_yF_z$ (wherein x is 4, y is an integer equal to or larger than 4, and z is a positive integer, provided that y+z is 10).

Patent Literature 1 states that the method disclosed in Patent Literature 1 can selectively etch the multi-layer film with respect to the mask, and form a hole or the like having a good shape while preventing a situation in which a hole or the like is clogged by a deposited film.

However, a further improvement in etching rate has been desired from the viewpoint of productivity.

Patent Literature 2 discloses a method that etches a silicon-containing film using a process gas that includes a fluorohydrocarbon compound that is represented by $C_4H_2F_6$, $C_4H_3F_5$, or $C_4H_4F_4$, and includes an alicyclic structure or an unsaturated bond.

Patent Literature 2 discloses $CF_4$, $C_4F_6$, and the like as a second gas that may be used in combination with the fluorohydrocarbon compound.

However, when a plasma etching process is performed using the process gas disclosed in Patent Literature 2 that includes the fluorohydrocarbon compound that includes an alicyclic structure or an unsaturated bond, a hole or the like is easily clogged. Therefore, the method disclosed in Patent Literature 2 is not suitable for fine processing.

CITATION LIST

Patent Literature

Patent Literature 1: WO2014/104290
Patent Literature 2: WO2014/070838

SUMMARY OF INVENTION

Technical Problem

The invention was conceived in view of the above situation. An object of the invention is to provide a plasma etching method that can selectively etch a silicon-containing film with respect to a mask, and form a hole or a trench having a good shape within a short time.

Note that the expression "selectively etch a silicon-containing film with respect to a mask" used herein means that the selectivity ratio of the silicon-containing film with respect to the mask that is defined by the following expression is 4 or more.

Selectivity ratio of silicon-containing film with respect to mask=etching rate of silicon-containing film/etching rate of mask

Solution to Problem

In order to solve the above problem, the inventor conducted extensive studies with regard to a plasma etching method that etches a silicon-containing film using a process gas. As a result, the inventor found that it is possible to selectively etch a silicon-containing film with respect to a mask, and form a hole or a trench having a good shape within a short time, by utilizing a specific linear saturated fluorohydrocarbon compound and a specific gaseous fluorine-containing compound in combination.

One aspect of the invention provides the following plasma etching method (see (1) to (10)).

(1) A plasma etching method including subjecting a silicon-containing film to plasma etching using a process gas, the process gas including a linear saturated fluorohydrocarbon compound represented by the following formula (1), and a gaseous fluorine-containing compound (excluding the compound represented by the formula (1)) that functions as a fluorine radical source under plasma etching conditions, $$C_xH_yF_z \quad (1)$$

wherein x represents 3 or 4, y represents an integer from 5 to 9, and z represents an integer from 1 to 3.

(2) The plasma etching method according to (1), wherein the process gas includes the linear saturated fluorohydrocarbon compound and the gaseous fluorine-containing compound in a volume ratio of 1:99 to 99:1.

(3) The plasma etching method according to (1) or (2), wherein the fluorine-containing compound is a compound selected from the group consisting of $CF_4$, $CHF_3$, $NF_3$, and $SF_6$.

(4) The plasma etching method according to any one of (1) to (3), wherein the process gas further includes a reactive gas so that the volume ratio of the total amount of the linear saturated fluorohydrocarbon compound and the gaseous fluorine-containing compound to the reactive gas is 1:0.1 to 1:5.

(5) The plasma etching method according to (4), wherein the reactive gas is either or both of oxygen gas and nitrogen gas.
(6) The plasma etching method according to any one of (1) to (5), wherein the process gas further includes a non-reactive gas so that the volume ratio of the total amount of the linear saturated fluorohydrocarbon compound and the gaseous fluorine-containing compound to the non-reactive gas is 1:0.1 to 1:5.
(7) The plasma etching method according to (6), wherein the non-reactive gas is at least one non-reactive gas selected from the group consisting of helium, argon, neon, krypton, and xenon.
(8) The plasma etching method according to any one of (1) to (7), wherein the silicon-containing film is a film that includes a silicon oxide film and a silicon nitride film.
(9) The plasma etching method according to any one of (1) to (7), wherein the silicon-containing film is a silicon oxide film, a silicon nitride film, or a multi-layer film thereof.
(10) The plasma etching method according to any one of (1) to (9), including forming an ArF resist, a KrF resist, an i-line resist, a g-line resist, an amorphous carbon film, or a coating-type carbon film on the surface of the silicon-containing film as a mask.

Advantageous Effects of Invention

One aspect of the invention thus provides a plasma etching method that can selectively etch the silicon-containing film with respect to the mask, and form a hole or a trench having a good shape within a short time.

BRIEF DESCRIPTION OF DRAWINGS

FIG. 1 is a schematic view illustrating the layer structure of the sample used in the examples.

DESCRIPTION OF EMBODIMENTS

A plasma etching method (hereinafter may be referred to as "method") according to one embodiment of the invention includes subjecting a silicon-containing film to plasma etching using a process gas, the process gas including a linear saturated fluorohydrocarbon compound represented by the formula (1) (hereinafter may be referred to as "etching gas (α)"), and a gaseous fluorine-containing compound (excluding the compound represented by the formula (1)) that functions as a fluorine radical source under plasma etching conditions (hereinafter may be referred to as "etching gas (β)").

The term "etching" used herein refers to a technique that is used for a semiconductor device production process and the like, and etches the etching target to form a highly integrated fine pattern. The term "plasma etching" used herein refers to a technique that applies a high-frequency electric field to an etching gas to effect a glow discharge and decompose (separate) the etching gas into chemically active ions and radicals, and effects etching by utilizing their reactivity.

Process Gas

The etching gas (α) that is included in the process gas used in connection with the method according to one embodiment of the invention is the linear saturated fluorohydrocarbon compound represented by the following formula (1).

$$C_xH_yF_z \quad (1)$$

wherein x represents 3 or 4, y represents an integer from 5 to 9, and z represents an integer from 1 to 3.

Bowing may easily occur when a linear saturated fluorohydrocarbon compound having 2 or less carbon atoms is used. On the other hand, the etching rate may decrease when a linear saturated fluorohydrocarbon compound having 5 or more carbon atoms is used. Moreover, a film may be deposited around the entrance of a hole or the like, whereby the shape of the hole or the like may deteriorate.

It may be difficult to selectively etch the silicon-containing film with respect to a mask when a linear saturated fluorohydrocarbon compound having 4 or more fluorine atoms is used.

When a cyclic fluorohydrocarbon compound or an unsaturated fluorohydrocarbon compound is used instead of the etching gas (α), the etching rate may decrease, and a film may be deposited around the entrance of a hole or the like, whereby the shape of the hole or the like may deteriorate.

Examples of the etching gas (α) include a compound represented by $C_3H_7F$, such as 1-fluoropropane and 2-fluoropropane; a compound represented by $C_3H_6F_2$, such as 1,1-difluoropropane, 1,2-difluoropropane, 1,3-difluoropropane, and 2,2-difluoropropane; a compound represented by $C_3H_5F_3$, such as 1,1,1-trifluoropropane, 1,1,2-trifluoropropane, 1,2,2-trifluoropropane, and 1,1,3-trifluoropropane; a compound represented by $C_4H_9F$, such as 1-fluoro-n-butane, 2-fluoro-n-butane, 1-fluoro-2-methylpropane, and 2-fluoro-2-methylpropane; a compound represented by $C_4H_8F_2$, such as 1,1-difluoro-n-butane, 1,2-difluoro-n-butane, 1,3-difluoro-n-butane, 1,4-difluoro-n-butane, 2,2-difluoro-n-butane, 2,3-difluoro-n-butane, 1,1-difluoro-2-methylpropane, 1,2-difluoro-2-methylpropane, and 1,3-difluoro-2-methylpropane; a compound represented by $C_4H_7F_3$, such as 1,1,1-trifluoro-n-butane, 1,1,2-trifluoro-n-butane, 1,1,3-trifluoro-n-butane, 1,1,4-trifluoro-n-butane, 1,1,1-trifluoro-2-methylpropane, and 1,1,2-trifluoro-2-methylpropane; and the like.

These etching gases (α) may be used either alone or in combination. Note that it is preferable to use one type of etching gas (α) alone since the advantageous effects of the invention are significantly achieved.

Many of the etching gases (α) are known substances, and may be produced using a known method. For example, 2-fluoro-n-butane may be produced using the method described in J. Org. Chem, 44 (22), 3872 (1987). 2,2-Difluoro-n-butane may be produced using the method disclosed in JP-A-05-221892, JP-A-06-100475, or the like.

A commercially-available product may be used as the etching gas (α) either directly or after purification.

The etching gas (β) that is included in the process gas used in connection with the method according to one embodiment of the invention is the gaseous fluorine-containing compound (excluding the compound represented by the formula (1)) that functions as a fluorine radical source under plasma etching conditions.

The etching gas (β) generates fluorine radicals under plasma etching conditions. It is preferable that the etching gas (β) does not have a capability to form a polymer film (i.e., does not form a polymer film when only the etching gas (β) is subjected to plasma etching conditions).

Examples of the etching gas (β) include $CF_4$, $CHF_3$, $NF_3$, $SF_6$, and the like.

These etching gases (β) may be used either alone or in combination.

The process gas used in connection with the method according to one embodiment of the invention includes the etching gas (α) and the etching gas (β). When the etching gas (α) and the etching gas (β) are used in combination, it is possible to selectively etch the silicon-containing film with respect to a mask while etching the silicon-containing film at a high etching rate due to the synergistic effect of the etching gas (α) and the etching gas (β).

The ratio (volume ratio) (etching gas (α):etching gas (β)) of the etching gas (α) to the etching gas (β) in the process gas is not particularly limited, but is preferably 1:99 to 99:1, and more preferably 5:95 to 70:30.

The process gas may include a reactive gas such as oxygen gas and nitrogen gas. It is possible to more selectively etch the silicon-containing film with respect to a mask while preventing a situation in which etching stops due to the deposition of a reaction product at the bottom of a hole or the like, by utilizing the process gas that includes the reactive gas.

When the process gas includes the reactive gas, the ratio (volume ratio) (etching gas:reactive gas) of the etching gas (i.e., the total amount of etching gas (α) and etching gas (β)) to the reactive gas in the process gas is preferably 1:0.1 to 1:5, and more preferably 1:0.5 to 1:3.

The process gas may include a non-reactive gas such as helium, argon, neon, krypton, and xenon. The etching performance of the process gas can be adjusted by changing the ratio of the non-reactive gas, for example.

When the process gas includes the non-reactive gas, the ratio (volume ratio) (etching gas:non-reactive gas) of the etching gas (i.e., the total amount of etching gas (α) and etching gas (β)) to the non-reactive gas in the process gas is preferably 1:0.1 to 1:5, and more preferably 1:0.5 to 1:2.

When effecting plasma etching, the process gas is introduced into a processing chamber (as described later). In this case, a container that is filled with each component (hereinafter may be referred to as "constituent gas") of the process gas and the processing chamber are normally connected through a pipe, and the constituent gas is discharged from each container at a specific flow rate, and mixed to produce the process gas, which is introduced into the processing chamber.

It is preferable that the constituent gas contained in the container have high purity. In particular, it is preferable that the etching gas (α) have high purity. The purity of the etching gas (α) is 99.9 vol % or more. When the etching gas (α) has high purity, it is possible to more easily achieve the advantageous effects of the invention. When the etching gas (α) has high purity, a difference in gas purity rarely occurs between the initial stage and the stage when the amount of gas has decreased, and it is possible to effect plasma etching in a more stable manner.

The flow rate of each constituent gas may be appropriately determined taking account of the desired composition of the process gas. For example, the flow rate of the etching gas (α) is preferably 1 to 30 sccm, and more preferably 5 to 15 sccm. The flow rate of the etching gas (β) is preferably 1 to 60 sccm, and more preferably 10 to 40 sccm. The flow rate of the reactive gas is preferably 0 to 100 sccm, and more preferably 0 to 60 sccm. The flow rate of the non-reactive gas is preferably 0 to 1,000 sccm, and more preferably 100 to 400 sccm.

Plasma Etching Method

The method according to one embodiment of the invention subjects the silicon-containing film to plasma etching using the process gas.

Examples of the silicon-containing film include a single-layer film such as a silicon oxide film, a silicon nitride film, and an amorphous silicon film; a multi-layer film in which two or more single-layer films are stacked; and the like. It is preferable that the silicon-containing film be a silicon oxide film, a silicon nitride film, or a multi-layer film thereof, and more preferably a multi-layer film in which a silicon oxide film and a silicon nitride film are stacked, since the advantageous effects of the invention are more significantly achieved.

Examples of the multi-layer film in which a silicon oxide film and a silicon nitride film are stacked, include a multi-layer film in which silicon oxide films and silicon nitride films are alternately stacked. Examples of the etching target that includes such a multi-layer film, include a material that is used when producing a three-dimensional NAND flash memory. The number of layers included in the multi-layer film in which silicon oxide films and silicon nitride films are alternately stacked, is not particularly limited. For example, the multi-layer film has a configuration in which 1 to 128 silicon oxide films and 1 to 128 silicon nitride films are alternately stacked (i.e., 2 to 256 layers in total). It is preferable that the multi-layer film in which silicon oxide films and silicon nitride films are alternately stacked, include 24 or more layers, and more preferably 64 or more layers, since the advantageous effects of the invention are more significantly achieved.

The thickness of the silicon-containing film (or the total thickness of the silicon-containing film when the silicon-containing film is a multi-layer film) is not particularly limited, but is normally 1,000 to 5,000 nm, and preferably 1,500 to 4,000 nm.

The method according to one embodiment of the invention can efficiently form a contact hole or the like having a high aspect ratio even when the thickness of the silicon-containing film is large.

The method according to one embodiment of the invention normally provides a mask having a specific given pattern on the surface of the silicon-containing film.

The type of mask is not particularly limited. It is preferable that the mask be an organic film such as an ArF resist, a KrF resist, an i-line resist, a g-line resist, an amorphous carbon film, or a coating-type carbon film, since the silicon-containing film can be more selectively etched with respect to the mask.

The thickness of the mask may be appropriately selected taking account of the type of mask, and the like. The thickness of the mask is normally 1,000 to 5,000 nm, and preferably 1,500 to 3,500 nm.

The method according to one embodiment of the invention is implemented by placing the etching target in a processing chamber, introducing the process gas into the processing chamber as described above, and generating a plasma using a plasma generation apparatus, for example.

The pressure inside the chamber into which the process gas has been introduced is normally 0.0013 to 1,300 Pa, and preferably 0.13 to 13 Pa.

Examples of the plasma generation apparatus include a helicon wave-type plasma generation apparatus, a high frequency induction-type plasma generation apparatus, a parallel plate-type plasma generation apparatus, a magnetron-type plasma generation apparatus, a microwave-type plasma generation apparatus, and the like.

The plasma density is not particularly limited. It is preferable to effect etching in a high-density plasma atmosphere having a plasma density of $10^{11}$ cm$^{-3}$ or more, and more preferably $10^{12}$ to $10^{13}$ cm$^{-3}$, in order to more reliably achieve the advantageous effects of the invention.

The temperature of the etching target that is reached during etching is not particularly limited, but is preferably −20 to +300° C., more preferably −20 to +100° C., and still more preferably −20 to +60° C. The temperature of the etching target may or may not be controlled by cooling or the like.

The method according to one embodiment of the invention can selectively etch the silicon-containing film with respect to the mask, and form a hole or a trench having a good shape within a short time.

For example, the selectivity ratio of the silicon-containing film with respect to the mask that is achieved by the method according to one embodiment of the invention is normally 4 or more, and preferably 5 or more. The upper limit of the selectivity ratio of the silicon-containing film with respect to the mask is not particularly limited, but is normally 15 or less.

The etching rate of the silicon-containing film that is achieved by the method according to one embodiment of the invention is normally 150 nm/min or more, and preferably 200 nm/min or more. The upper limit of the etching rate of the silicon-containing film is not particularly limited, but is normally 600 nm/min or less.

The amount of bowing when a hole or a trench having a good shape is formed by the method according to one embodiment of the invention is normally 65 nm or less, and preferably 50 nm or less. The lower limit of the amount of bowing is not particularly limited. It is preferable that the amount of bowing be as close to 0 nm as possible.

It is possible to more efficiently form a deep hole or trench by utilizing the method according to one embodiment of the invention. For example, it is possible to efficiently form a hole having an aspect ratio of 10 or more by utilizing the method according to one embodiment of the invention.

Since the method according to one embodiment of the invention has the features described above, the method according to one embodiment of the invention is suitably used when producing a three-dimensional semiconductor memory such as a three-dimensional NAND flash memory.

EXAMPLES

The invention is further described below by way of examples. Note that the invention is not limited to the following examples.
Sample
A wafer (1) having the layer structure illustrated in FIG. 1 was used as a plasma etching sample.

The wafer (1) includes a silicon substrate (2), a five-layer multi-layer film (5) which is formed on the silicon substrate (2) and in which silicon oxide films (3a, 3b, 3c) having a thickness of 200 nm and silicon nitride film (4a, 4b) having a thickness of 200 nm are alternately stacked, and a coating-type carbon film (7) that is formed on the multi-layer film (5) and has a hole pattern (6).
Cross-Sectional Observation The cross section of the sample subjected to etching was observed using a scanning electron microscope. The selectivity ratio of the silicon-containing film with respect to the coating-type carbon film, and the amount of bowing (i.e., the maximum amount of extent with respect to the upper part of the silicon-containing film (i.e., the layer indicated by 3c in FIG. 1) in the transverse direction (the difference between the hole diameter in the initial stage of etching and the maximum hole diameter achieved by etching)) were calculated based on the observation results.

The selectivity ratio of the silicon-containing film with respect to the coating-type carbon film was calculated using the above expression. The etching rate of the silicon-containing film and the etching rate of the coating-type carbon film were calculated based on the difference from the thickness before etching. When a deposit adheres to the coating-type carbon film, the thickness of the coating-type carbon film refers to the total thickness of the coating-type carbon film and the deposit. Therefore, when it appears that the coating-type carbon film is etched to only a small extent due to the adhesion of the deposit, the etching rate of the coating-type carbon film decreases, and the selectivity ratio increases. When a large amount of deposit adheres to the coating-type carbon film, and the total thickness of the coating-type carbon film and the deposit is larger than the thickness of the coating-type carbon film before etching, the etching rate of the coating-type carbon film is a negative value, and the selectivity ratio is also a negative value.

Specifically, it is necessary to take account of the fact that a deposit affects the selectivity ratio when evaluating the results obtained in the examples.

Example 1

The sample was placed in an etching chamber of a parallel plate-type plasma etching apparatus. After evacuating the system, 1-fluorobutane ($C_4H_9F$), $CF_4$, oxygen gas, and argon gas were introduced into the etching chamber to effect etching under the following conditions.

When the cross section of the sample was observed, the hole had a good shape. The silicon-containing film was etched at a high etching rate. The selectivity ratio of the silicon-containing film with respect to the coating-type carbon film was 6.5, the etching rate of the silicon-containing film was 210 nm/min, and the amount of bowing was 52 nm.
Etching Conditions
Process Gas
1-Fluorobutane (8 sccm)
$CF_4$ (34 sccm)
Oxygen gas (38 sccm)
Argon gas (400 sccm)
Pressure inside processing chamber: 3.99 Pa
Electric power (upper electrode/lower electrode): 1,000 W (60 MHz)/360 W (2 MHz)
Stage temperature: −15° C.
Etching time: 240 sec Example 2

Etching was effected in the same manner as in Example 1, except that 2-fluorobutane ($C_4H_9F$) (8 sccm) was introduced instead of 1-fluorobutane.

When the cross section of the sample was observed, the hole had a good shape. The silicon-containing film was etched at a high etching rate. The selectivity ratio of the silicon-containing film with respect to the coating-type carbon film was 6.2, the etching rate of the silicon-containing film was 240 nm/min, and the amount of bowing was 45 nm.

Example 3

Etching was effected in the same manner as in Example 1, except that 2,2-difluorobutane ($C_4H_8F_2$) (8 sccm) was introduced instead of 1-fluorobutane.

When the cross section of the sample was observed, the hole had a good shape. The silicon-containing film was etched at a high etching rate. The selectivity ratio of the silicon-containing film with respect to the coating-type carbon film was 5.3, the etching rate of the silicon-containing film was 255 nm/min, and the amount of bowing was 50 nm.

Example 4

Etching was effected in the same manner as in Example 1, except that 1,1,1-trifluorobutane ($C_4H_7F_3$) (11 sccm) was introduced instead of 1-fluorobutane, and the flow rate of $CF_4$ was changed to 40 sccm.

When the cross section of the sample was observed, the hole had a good shape. The silicon-containing film was etched at a high etching rate. The selectivity ratio of the silicon-containing film with respect to the coating-type carbon film was 5.0, the etching rate of the silicon-containing film was 258 nm/min, and the amount of bowing was 45 nm.

Example 5

Etching was effected in the same manner as in Example 1, except that 2-fluoropropane ($C_3H_7F$) (12 sccm) was introduced instead of 1-fluorobutane, and the flow rate of $CF_4$ was changed to 40 sccm.

When the cross section of the sample was observed, the hole had a good shape. The silicon-containing film was etched at a high etching rate. The selectivity ratio of the silicon-containing film with respect to the coating-type carbon film was 4.9, the etching rate of the silicon-containing film was 234 nm/min, and the amount of bowing was 49 nm.

Comparative Example 1

Etching was effected in the same manner as in Example 1, except that fluoromethane ($CH_3F$) (55 sccm) was introduced instead of 1-fluorobutane.

The silicon-containing film was etched at a high etching rate. When the cross section of the sample was observed, the entrance of the hole had broadened. The selectivity ratio of the silicon-containing film with respect to the coating-type carbon film was 5.1, the etching rate of the silicon-containing film was 240 nm/min, and the amount of bowing was 63 nm.

Comparative Example 2

Etching was effected in the same manner as in Example 1, except that the flow rate of 1-fluorobutane was changed to 12 sccm, and $CF_4$ was not introduced.

The silicon-containing film was etched at a low etching rate. When the cross section of the sample was observed, the coating-type carbon film had disappeared, and a hole having the desired shape (size) could not be formed. The selectivity ratio of the silicon-containing film with respect to the coating-type carbon film was 0.74, and the etching rate of the silicon-containing film was 96 nm/min.

Comparative Example 3

Etching was effected in the same manner as in Example 1, except that 2-fluorobutane ($C_4H_9F$) (12 sccm) was introduced instead of 1-fluorobutane, and $CF_4$ was not introduced.

The silicon-containing film was etched at a low etching rate. When the cross section of the sample was observed, the coating-type carbon film had disappeared, and a hole having the desired shape (size) could not be formed. The selectivity ratio of the silicon-containing film with respect to the coating-type carbon film was 0.53, and the etching rate of the silicon-containing film was 99 nm/min.

Comparative Example 4

Etching was effected in the same manner as in Example 1, except that 2,2-difluorobutane ($C_4H_8F_2$) (12 sccm) was introduced instead of 1-fluorobutane, and $CF_4$ was not introduced.

The silicon-containing film was etched at a low etching rate. When the cross section of the sample was observed, the coating-type carbon film had disappeared, and a hole having the desired shape (size) could not be formed. The selectivity ratio of the silicon-containing film with respect to the coating-type carbon film was 0.41, and the etching rate of the silicon-containing film was 125 nm/min.

Comparative Example 5

Etching was effected in the same manner as in Example 1, except that 1,1,1-trifluorobutane ($C_4H_7F_3$) (12 sccm) was introduced instead of 1-fluorobutane, and $CF_4$ was not introduced.

The silicon-containing film was etched at a low etching rate. When the cross section of the sample was observed, the coating-type carbon film had disappeared, and a hole having the desired shape (size) could not be formed. The selectivity ratio of the silicon-containing film with respect to the coating-type carbon film was 0.48, and the etching rate of the silicon-containing film was 86 nm/min.

Comparative Example 6

Etching was effected in the same manner as in Example 1, except that 2-fluoropropane (12 sccm) was introduced instead of 1-fluorobutane, and $CF_4$ was not introduced.

The silicon-containing film was etched at a low etching rate. When the cross section of the sample was observed, the coating-type carbon film had disappeared, and a hole having the desired shape (size) could not be formed. The selectivity ratio of the silicon-containing film with respect to the coating-type carbon film was 0.59, and the etching rate of the silicon-containing film was 43 nm/min.

Comparative Example 7

Etching was effected in the same manner as in Example 1, except that 1-fluorobutane was not introduced.

The silicon-containing film was etched at a high etching rate. When the cross section of the sample was observed, the coating-type carbon film had disappeared, and a hole having the desired shape (size) could not be formed. The selectivity ratio of the silicon-containing film with respect to the coating-type carbon film was 0.45, and the etching rate of the silicon-containing film was 340 nm/min.

Comparative Example 8

Etching was effected in the same manner as in Example 1, except that 1,1,1,3,3-pentafluorobutane ($C_4H_5F_5$) (8 sccm) was introduced instead of 1-fluorobutane.

The silicon-containing film was etched at a high etching rate. When the cross section of the sample was observed, the hole had a good shape. However, the selectivity ratio was low. The selectivity ratio of the silicon-containing film with respect to the coating-type carbon film was 3.3, the etching rate of the silicon-containing film was 250 nm/min, and the amount of bowing was 47 nm.

Comparative Example 9

Etching was effected in the same manner as in Example 1, except that 3-fluoro-1-butene ($C_4H_7F$) (8 sccm) was introduced instead of 1-fluorobutane, and the flow rate of $CF_4$ was changed to 40 sccm.

When the cross section of the sample was observed, a deposited film adhered to the hole pattern of the coating-type carbon film (i.e., the entrance of the holes was closed), and a hole having the desired shape (size) could not be formed. A film was deposited on the coating-type carbon film, and the selectivity ratio of the silicon-containing film with respect to the coating-type carbon film was −3.8. A negative selectivity ratio means that a film was deposited in a state in which the hole pattern of the coating-type carbon film was not etched. The etching rate of the silicon-containing film was 117 nm/min.

Comparative Example 10

Etching was effected in the same manner as in Example 1, except that 2-fluoropentane ($C_5H_{11}F$)(6 sccm) was introduced instead of 1-fluorobutane, and the flow rate of $CF_4$ was changed to 40 sccm.

When the cross section of the sample was observed, a deposited film adhered to the hole pattern of the coating-type carbon film (i.e., the entrance of the holes was closed), and a hole having the desired shape (size) could not be formed. A film was deposited on the coating-type carbon film, and the selectivity ratio of the silicon-containing film with respect to the coating-type carbon film was 28. The etching rate of the silicon-containing film was 140 nm/min.

The results obtained in the examples and the comparative examples are listed in Table 1.

TABLE 1

| | | | Example | | | | | Comparative Example | | |
|---|---|---|---|---|---|---|---|---|---|---|
| | | | 1 | 2 | 3 | 4 | 5 | 1 | 2 | 3 |
| Process gas (sccm) | Etching gas (α) | 1-Fluorobutane | 8 | — | — | — | — | — | 12 | — |
| | | 2-Fluorobutane | — | 8 | — | — | — | — | — | 12 |
| | | 2,2-Difluorobutane | — | — | 8 | — | — | — | — | — |
| | | 1,1,1-Trifluoro butane | — | — | — | 11 | — | — | — | — |
| | | 2-Fluoropropane | — | — | — | — | 12 | — | — | — |
| | Etching gas (β) | Tetrafluoromethane | 34 | 34 | 34 | 40 | 40 | 34 | — | — |
| | Additional fluorine-containing compound | Fluoromethane | — | — | — | — | — | 55 | — | — |
| | | 1,1,1,3,3-Pentafluorobutane | — | — | — | — | — | — | — | — |
| | | 3-Fluoro-1-butene | — | — | — | — | — | — | — | — |
| | | 2-Fluoropentane | — | — | — | — | — | — | — | — |
| | | Oxygen gas | 38 | 38 | 38 | 38 | 38 | 38 | 38 | 38 |
| | | Argon gas | 400 | 400 | 400 | 400 | 400 | 400 | 400 | 400 |
| Selectivity ratio of silicon-containing film with respect to coating-type carbon film | | | 6.5 | 6.2 | 5.3 | 5.0 | 4.9 | 5.1 | 0.74 | 0.53 |
| Etching rate (nm/min) of silicon-containing film | | | 210 | 240 | 255 | 258 | 234 | 240 | 96 | 99 |
| Amount of bowing (nm) | | | 52 | 45 | 50 | 45 | 49 | 63 | — | — |

| | | | Comparative Example | | | | | | |
|---|---|---|---|---|---|---|---|---|---|
| | | | 4 | 5 | 6 | 7 | 8 | 9 | 10 |
| Process gas (sccm) | Etching gas (α) | 1-Fluorobutane | — | — | — | — | — | — | — |
| | | 2-Fluorobutane | — | — | — | — | — | — | — |
| | | 2,2-Difluorobutane | 12 | — | — | — | — | — | — |
| | | 1,1,1-Trifluoro butane | — | 12 | — | — | — | — | — |
| | | 2-Fluoropropane | — | — | 12 | — | — | — | — |
| | Etching gas (β) | Tetrafluoromethane | — | — | — | 34 | 34 | 40 | 40 |
| | Additional fluorine-containing compound | Fluoromethane | — | — | — | — | — | — | — |
| | | 1,1,1,3,3-Pentafluorobutane | — | — | — | — | 8 | — | — |
| | | 3-Fluoro-1-butene | — | — | — | — | — | 8 | — |
| | | 2-Fluoropentane | — | — | — | — | — | — | 6 |
| | | Oxygen gas | 38 | 38 | 38 | 38 | 38 | 38 | 38 |
| | | Argon gas | 400 | 400 | 400 | 400 | 400 | 400 | 400 |
| Selectivity ratio of silicon-containing film with respect to coating-type carbon film | | | 0.41 | 0.48 | 0.59 | 0.45 | 3.3 | −3.8 | 28 |
| Etching rate (nm/min) of silicon-containing film | | | 125 | 86 | 43 | 340 | 250 | 117 | 140 |
| Amount of bowing (nm) | | | — | — | — | — | 47 | — | — |

In Examples 1 to 5 in which the etching gas (α) and the etching gas (β) were used in combination as the etching gas, a high selectivity ratio with respect to the mask was achieved while maintaining a high etching rate, and etching could be implemented in a state in which the amount of bowing was small, and a good pattern shape was obtained, while preventing a situation in which a deposited film adhered to the hole pattern (i.e., the entrance of the holes was closed) (see Table 1).

In Comparative Examples 2 to 7 in which only the etching gas (α) or the etching gas (β) was used as the etching gas, the selectivity ratio with respect to the mask was low, the mask disappeared to such an extent that it was impossible to measure the amount of bowing, and a hole pattern having the desired shape (size) could not be formed.

In Comparative Examples 1 and 8 to 10 in which the etching gas (β), and a fluorine-containing compound other than the etching gas (α), were used in combination as the etching gas, the width of the entrance of the hole pattern increased (Comparative Example 1), the selectivity ratio with respect to the mask was low (Comparative Example 8), or the etching rate decreased, and a deposited film adhered to the hole pattern (i.e., the entrance of the holes was closed) (Comparative Examples 9 and 10), and a hole pattern having the desired shape (size) could not be formed.

REFERENCE SIGNS LIST

1: Wafer
2: Silicon substrate
3a, 3b, 3c: Silicon oxide film
4a, 4b: Silicon nitride film
5: Multi-layer film
6: Hole pattern
7: Coating-type carbon film

The invention claimed is:

1. A plasma etching method for selectively etching a silicon-containing film with respect to a mask formed of an organic film without changing a process gas in the middle, the process gas comprising a linear saturated fluorohydrocarbon compound represented by a formula (1), and a gaseous fluorine-containing compound (excluding the compound represented by the formula (1)) that functions as a fluorine radical source under plasma etching conditions, $$C_xH_yF_z \quad (1)$$

wherein x represents 3 or 4, y represents an integer from 5 to 9, and z represents an integer from 1 to 3.

2. The plasma etching method according to claim 1, wherein the process gas comprises the linear saturated fluorohydrocarbon compound and the gaseous fluorine-containing compound in a volume ratio of 1:99 to 99:1.

3. The plasma etching method according to claim 1, wherein the fluorine-containing compound is a compound selected from a group consisting of $CF_4$, $CHF_3$, $NF_3$, and $SF_6$.

4. The plasma etching method according to claim 1, wherein the process gas further comprises a reactive gas so that a volume ratio of a total amount of the linear saturated fluorohydrocarbon compound and the gaseous fluorine-containing compound to the reactive gas is 1:0.1 to 1:5.

5. The plasma etching method according to claim 4, wherein the reactive gas is either or both of oxygen gas and nitrogen gas.

6. The plasma etching method according to claim 1, wherein the process gas further comprises a non-reactive gas so that a volume ratio of a total amount of the linear saturated fluorohydrocarbon compound and the gaseous fluorine-containing compound to the non-reactive gas is 1:0.1 to 1:5.

7. The plasma etching method according to claim 6, wherein the non-reactive gas is at least one non-reactive gas selected from a group consisting of helium, argon, neon, krypton, and xenon.

8. The plasma etching method according to claim 1, wherein the silicon-containing film is a film that comprises a silicon oxide film and a silicon nitride film.

9. The plasma etching method according to claim 1, wherein the silicon-containing film is a silicon oxide film, a silicon nitride film, or a multi-layer film thereof.

10. The plasma etching method according to claim 1, wherein the mask is an organic film including an ArF resist, a KrF resist, an i-line resist, a g-line resist, an amorphous carbon film, or a coating-type carbon film.

11. The plasma etching method according to claim 1, wherein a hole having an aspect ratio of 10 or more is formed in the silicon-containing film.

* * * * *